(12) United States Patent
Chen et al.

(10) Patent No.: US 12,130,331 B2
(45) Date of Patent: Oct. 29, 2024

(54) TEST INTERFACE CIRCUIT

(71) Applicant: NANYA TECHNOLOGY CORPORATION, New Taipei (TW)

(72) Inventors: Che-Wei Chen, New Taipei (TW); Kai-Li Liu, Taoyuan (TW); YuLin Sung, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 181 days.

(21) Appl. No.: 17/955,564

(22) Filed: Sep. 29, 2022

(65) Prior Publication Data

US 2024/0110980 A1    Apr. 4, 2024

(51) Int. Cl.
G01R 31/319  (2006.01)
G01R 31/30  (2006.01)
G01R 31/3185  (2006.01)

(52) U.S. Cl.
CPC . *G01R 31/31924* (2013.01); *G01R 31/31905* (2013.01)

(58) Field of Classification Search
CPC ........ G01R 31/3025; G01R 31/318572; G01R 31/31924
See application file for complete search history.

(56) References Cited

U.S. PATENT DOCUMENTS

| | | | | |
|---|---|---|---|---|
| 4,408,157 A * | 10/1983 | Beaubien | ............... | G01R 27/14 324/551 |
| 4,637,020 A * | 1/1987 | Schinabeck | ...... | G01R 31/31935 714/724 |
| 7,486,095 B2 * | 2/2009 | Long | .................. | G01R 31/2853 324/762.02 |
| 7,834,655 B1 | 11/2010 | Ou | | |
| 10,761,130 B1 * | 9/2020 | van der Wagt | .... | G01R 31/2601 |
| 2009/0251123 A1 * | 10/2009 | Henson | ...................... | G05F 1/56 323/311 |
| 2014/0325135 A1 | 10/2014 | Anderson et al. | | |
| 2017/0153288 A1 * | 6/2017 | Parekhji | ............... | G01R 1/0416 |

FOREIGN PATENT DOCUMENTS

| | | |
|---|---|---|
| TW | 200823917 | 6/2008 |
| TW | 200910373 | 3/2009 |
| TW | I684992 | 2/2020 |

OTHER PUBLICATIONS

"Office Action of Taiwan Counterpart Application", issued on Oct. 11, 2023, p. 1-p. 6.

* cited by examiner

*Primary Examiner* — Jermele M Hollington
*Assistant Examiner* — Temilade S Rhodes-Vivour
(74) *Attorney, Agent, or Firm* — JCIPRNET

(57) ABSTRACT

A test interface circuit includes N switches and N resistors, wherein N is a positive integer. A first end of each of the N switches is coupled to each of N test connection ends, a second end of each of the N switches receives a reference voltage. Each of the N first resistors is coupled to each of the N switches in series between each of the N test connection ends and the reference voltage. Wherein, each of the N switches is controlled by each of N control signals to be turned on or cut off.

11 Claims, 3 Drawing Sheets

TEST INTERFACE CIRCUIT

BACKGROUND OF THE INVENTION

Technical Field

The present invention generally relates to a test interface circuit and more particularly to the test interface circuit which can adjust impedances between a tester and a tested device.

Description of Related Art

In DDR3 SDRAM (Double-Data-Rate Three Synchronous Dynamic Random Access Memory) product, a requirement for an impedance match of tested pins is different from another memory products. Such as that, during a test operation, conventional art makes a special design to provide an external circuit board to adjust an impedance of pins of the DDR3 SDRAM product. That is, an extra cost is necessary for testing the DDR3 SDRAM product.

SUMMARY OF THE INVENTION

The present invention provides a test interface circuit which is used to adjust impedance between each of test channels of a tester and each of pins of a tested device.

The test interface circuit includes N switches and N resistors, wherein N is a positive integer. A first end of each of the N switches is coupled to each of N test connection ends, a second end of each of the N switches receives a reference voltage. Each of the N first resistors is coupled to each of the N switches in series between each of the N test connection ends and the reference voltage. Wherein, each of the N switches is controlled by each of N control signals to be turned on or cut off.

In summary, the test interface circuit is disposed between a tester and a tested device, and is used to adjust impedances between test channels of the tester and pins of the tested device. By turning on or cutting off each of the switches, the impedance between each of the test channels of the tester and each of the pins of the tested device can be adjusted, and impedance match requirement for each of the pins of the tested device can be met. Such as that, the tested device can be precisely tested.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
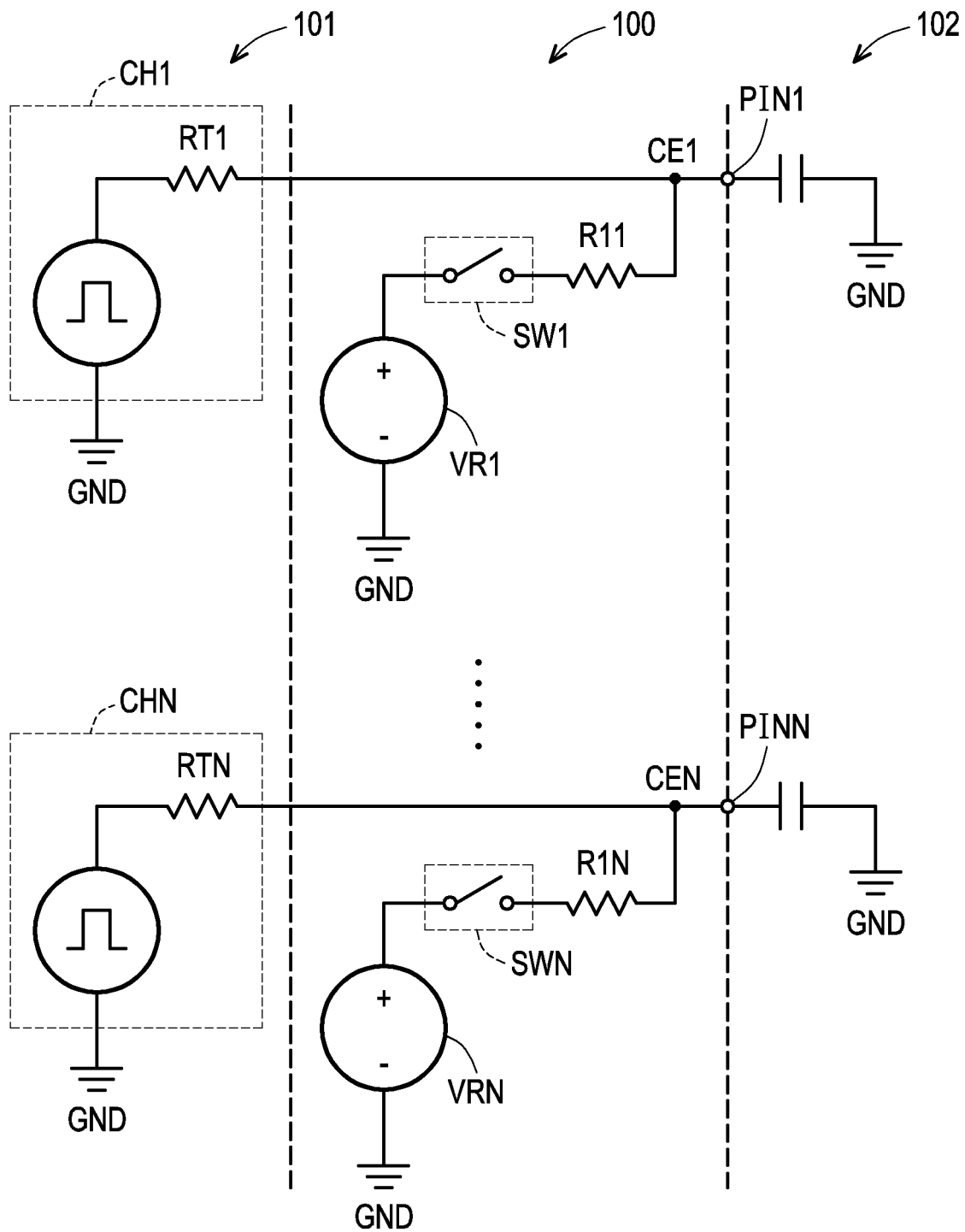
FIG. 1 illustrates a schematic diagram of a test interface circuit according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a schematic diagram of a test interface circuit according to an embodiment of present disclosure. The test interface circuit 100 is coupled between a tester 101 and a tested device 102. The test interface circuit 100 includes N resistors R11 to R1N and N switches SW1 to SWN. The N resistors R11 to R1N respectively correspond to the N switches SW1 to SWN. In this embodiment, the resistor R11 and the switch SW1 are coupled in series between a connection end CE1 and a reference voltage VR1, and the resistor R1N and the switch SWN are coupled in series between a connection end CEN and a reference voltage VRN. The connection end CE1 is used to connect a test channel CH1 of the tester 101 and a pin PIN1 of the tested device 102, and the connection end CEN is used to connect a test channel CHN of the tester 101 and a pin PINN of the tested device 102. In this embodiment, the test interface circuit 100 may be disposed on a probe card, and the tested device 102 may be a chip.

In the tester 101, the test channel CH1 has a terminal resistor RT1, and the test channel CHN has a terminal resistor RTN. Resistance of each of the terminal resistors RT1 to RTN may be 50 ohms. Each of the switches SW1 to SWN may be turned on or cut off to adjust an impedance between each of the pins PIN1 to PINN and each of the test channel CH1 to CHN. Take the switch SW1 and the resistor R11 as an example. If the switch SW1 is cut off, the impedance between the pin PIN1 and the test channel CH1 may be dominated by the terminal resistor RT1, and is substantially equal to 50 ohms. On the other hand, if the switch SW1 is turned on, the resistor R11 may be connected to the terminal resistor RT1 in parallel. If a resistance of the resistor R11 is substantially equal to 50 ohms, the impedance between the pin PIN1 and the test channel CH1 may be adjusted to substantially equal to 25 ohms.

That is, the impedance between each of the pins PIN1 to PINN and each of the test channels CH1 to CHN may be adjusted by turning on or cutting off each of the switches SW1 to SWN to meet a requirement of a specification of the tested device 102. For example, if the tested device 102 is DDR3 SDRAM (Double-Data-Rate Three Synchronous Dynamic Random Access Memory), the each of the switches SW1 to SWN may be turned on to adjust each of the corresponding impedances to 25 ohms.

In this embodiment, the resistance of each of the resistors R11 to R1N may be set to 50 ohms. In special, the resistance of each of the resistors R11 to R1N may not equal to 50 ohms precisely. In some embodiment, the resistance of each of the resistors R11 to R1N may be substantially equal to 50 ohms with some manufacture errors.

On the other hand, voltage values of the reference voltages VR1 to VRN may be same. In this embodiment, each of the voltage values of the reference voltages VR1 to VRN may be equal to half of an operation voltage of the tested device 102. In this embodiment, the reference voltages VR1 to VRN may be generated by a plurality of individual voltage sources. In some embodiments, the reference voltages VR1 to VRN may be generated by one voltage source.

It should be noted here, number of the switches SW1 to SWN and the resistors R11 to R1N may be determined according to a pin number of the tested device 102. If the tested device 102 has only one pin to be tested, there is only one switch and corresponding resistor needed in the test interface circuit 100. If there are N pins to be tested in the tested device 102, both of the number of the switches SW1 to SWN and the number of the resistors R11 to R1N are N in the test interface circuit 100, where N is an integer larger than 1.

Figure 2:
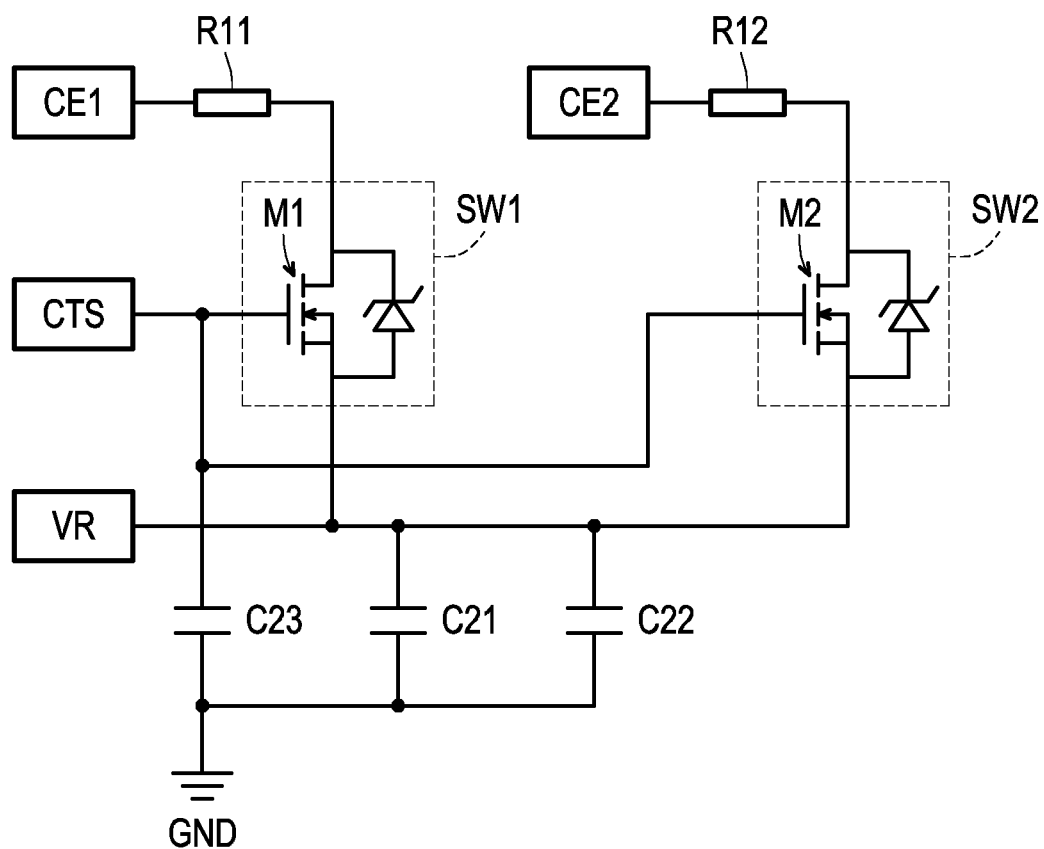
FIG. 2 illustrates a schematic diagram of a test interface circuit according to another embodiment of present disclosure.

Please refer to FIG. 2, which illustrates a schematic diagram of a test interface circuit according to another embodiment of present disclosure. The test interface circuit 200 includes resistors R1, R2, switches SW1, SW2 and capacitors C23 to C23. A first end of the resistor R1 is coupled to a connection end CE1, a second end of the resistor R1 is coupled to a first end of the switch SW1, and a second end of the switch SW1 receives a reference voltage VR. A second end of the resistor R2 is coupled to a connection end CE2, a second end of the resistor R2 is coupled to a first end of the switch SW2, and a second end of the switch SW2 receives the reference voltage VR. The connection end CE1 is used to connect one test channel of a tester and one pin of a tested device, and the connection end CE1 is used to connect another test channel of the tester and another pin of the tested device. In this embodiment, a resistance of each of the resistor R11 and R12 may be substantially equal to 50 ohms.

The switch SW11 is a transistor switch and formed by a transistor M1. The switch SW12 is also a transistor switch and formed by a transistor M2. In this embodiment, the transistors M1 and M2 may be P-type transistors. A first end of the transistor M1 is coupled to the second end of the resistor R11, a second end of the transistor M1 receives the reference voltage VR, and a control end of the transistor M1 receives a control signal CTS. A first end of the transistor M2 is coupled to the second end of the resistor R12, a second end of the transistor M2 receives the reference voltage VR, and a control end of the transistor M2 receives the control signal CTS. On the other hand, the capacitor C23 is couple between the control end of the transistor M1 and a reference ground voltage GND. The capacitors C21 and C22 are coupled in parallel between the second end of the transistor M1 and the reference ground voltage GND. The capacitors C21 to C23 are all voltage regulation capacitors.

In this embodiment, the transistors M1 and M2 are controlled by the same control signal CTS. When the control signal CTS is at a low voltage value, the transistor M1 and M2 may be turned on, and the resistors R11 and R12 can be provided to connect to terminal resistors of corresponding test channels in parallel. Such as that, impedances between each of the test channels of the tester and each of pins of the tested device can be adjusted. On the other hand, when the control signal CTS is at a high voltage value, the transistor M1 and M2 may be cut off, and the resistors R11 and R12 may be isolated from the test channels of the testers. The impedances between each of the test channels of the tester and each of pins of the tested device may be equal to a resistance of each of the terminal resistors of the test channels.

In this embodiment, the reference voltage VR may be provided by a same voltage source. A resistance of each of the resistors R11 and R12 may be substantially equal to 25 ohms.

In some embodiments, the switches SW1 and SW2 may be implemented by N-type transistors. If the switches SW1 and SW2 are implemented by N-type transistors, the switches SW1 and SW2 may be turned on if the control signal CTS is at a high voltage value, and the switches SW1 and SW2 may be cut off if the control signal CTS is at a low voltage value. Of course, the switches SW1 and SW2 may be implemented by any other electronic elements which are well known by a person skilled in this art, such as transmission gates.

The test interface circuit 200 may be disposed on a probe card. When a test operation is performed on the tested device, the probe card can connect the tested device with the tester by probing a plurality of pins on the tested device. Further, the tester may provide test patterns to the tested device through the probe card or measure test results from the tested device through the probe card.

In this embodiment, the switches SW1 and SW2 may be controlled to adjust the impedances between the tester and the tested device. Such as that, an impedance matching requirement of between the test channels of the tester and the pines of the tested device can be met, and the tested device can be quickly and precisely tested by the tester.

Figure 3:
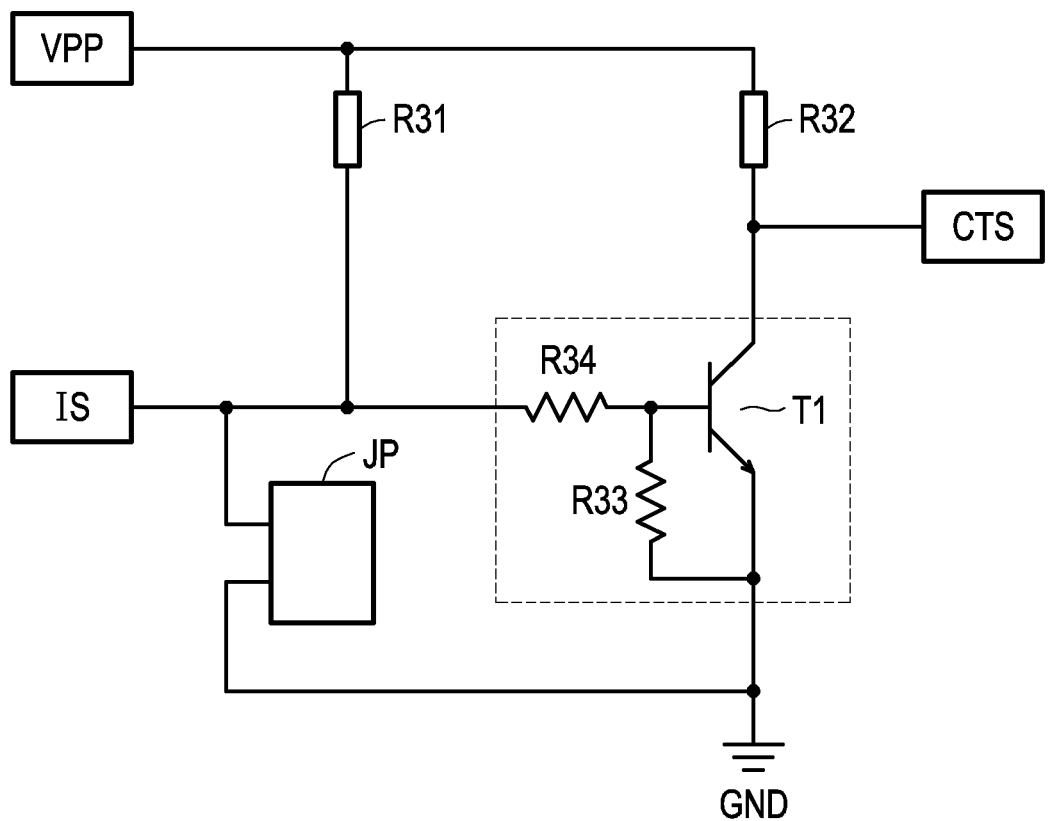
FIG. 3 illustrates a control signal generator of a test interface circuit according to an embodiment of present disclosure.

Please refer to FIG. 3, which illustrates a control signal generator of a test interface circuit according to an embodiment of present disclosure. The control signal generator 300 may be disposed on a probe card, and may be coupled to the switches SW1 and SW2 as shown in FIG. 2. The control signal generator 300 is used to generate a control signal CTS to control the switches SW1 and SW2 as shown in FIG. 2.

The control signal generator 300 includes resistors R31, R32, R33 and R34 and a transistor T1. The resistors R31 and R32 are both pull up resistors. A first end of the resistor R31 receives an operation voltage VPP, and a second end of the resistor R31 is coupled to a control end of the transistor T1 through the resistor R34. A first end of the resistor R32 receives the operation voltage VPP, and a second end of the resistor R32 is coupled to a first end of the transistor T1. A second end of the transistor T1 receives a reference ground voltage GND and coupled to the control end of the transistor T1 through the resistor R33. That is, the resistor R33 is coupled between the second end and the control end of the transistor T1. Also, the resistor R34 is coupled between the second end of the resistor R31 and the control end of the transistor T1. The control end of the transistor T1 receives an input signal IS through the resistor R34.

In this embodiment, the input signal IS may be provided by a tester. If the input signal IS is at logic high level, the transistor T1 may be turned on, and a control signal CTS which is equal to a reference ground voltage (with a low voltage value) can be generated by the control signal generator 300. On the other hand, if the input signal IS is at logic low level, the transistor T1 may be cut off, and the control signal CTS which is equal to the operation voltage (with a high voltage value) can be generated by the control signal generator 300. That is, the control signal generator 300 may generate the control signal CTS by inverting the input signal IS.

In this embodiment, the transistor T1 may be a bipolar junction transistor (BJT). In detail, the transistor T1 may be a NPN type BJT, which can invert and amplify the input signal IS to generate the control signal CTS.

It should be noted here, in this embodiment, a jump element JP can be disposed between one end of the resistor R34 and the reference ground end GND. The jump element JP can provide a shot-circuit path between the resistor R34 and the reference ground end GND. If the jump element JP is short circuited, a voltage on the control end of the transistor T1 may be forced to the reference ground voltage regardless a voltage value of the input signal IS. Such as that, the transistor T1 may be forced to be cut off. In a normal operation, the jump element JP may keep opening.

In one embodiment, number of the control signal generator 300 in the test interface circuit may be one. In this case, all of the switches in the test interface circuit can be controlled by the same control signal CTS. In another embodiment, number of the control signal generator 300 in the test interface circuit may be larger than 1, and also may be equal to number of the switches of the test interface circuit. In this case, each of the switches can be controlled by each of the control signal generators 300 individually.

In summary, the test interface circuit of present disclosure provides at least one switch which can decide whether to connect a resistor to a test channel of a tester. The test interface circuit is disposed on a probe card. Such as that, an impedance between the test channel and a pin of a tested device can be adjusted to meet a requirement of specification, and a test quality can be enhanced correspondingly. Also, since the test interface circuit is disposed on the probe card, cost for testing the tested device can be saved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A test interface circuit, comprising:
    N switches, wherein a first end of each of the N switches is coupled to each of N test connection ends, a second end of each of the N switches receives a reference voltage, and N is a positive integer;
    N first resistors, wherein each of the N first resistors is coupled to each of the N switches in series between each of the N test connection ends and the reference voltage,
    wherein each of the N switches is controlled by each of N control signals to be turned on or cut off; and
    N control signal generators, respectively coupled to the N switches, for providing the N control signals, wherein each of the N control signal generators comprises:
        a second resistor, having a first end receiving an operation voltage;
        a third resistor, having a first end receiving the operation voltage;
        a transistor, having a first end coupled to a second end of the second resistor, having a control end coupled to a second end of the third resistor, and having a second end coupled to a reference ground end, wherein the control end of the transistor receives an input signal; and
        a fourth resistor, coupled between the control end and the second end of the transistor.

2. The test interface circuit according to claim 1, wherein each of the N connection end is used to connect a pin of a tested device with a test channel of a tester.

3. The test interface circuit according to claim 2, wherein the reference voltage is half of an operation voltage of the tested device.

4. The test interface circuit according to claim 2, wherein each of the N resistors is configured to adjust an impedance between the pin of the tested device and the test channel of the tester.

5. The test interface circuit according to claim 1, wherein each of the N switches is a transistor switch.

6. The test interface circuit according to claim 1, wherein a resistance of each of the N first resistors is substantially equal to 50 ohms.

7. The test interface circuit according to claim 1, wherein each of the N control signal generators further comprises
    a fifth resistor, coupled on a path for the transistor receiving the input signal.

8. The test interface circuit according to claim 1, wherein the input signal is generated by a tester.

9. The test interface circuit according to claim 1, further comprising:
    at least one first capacitor, coupled between the second end of the N switches and a reference ground end.

10. The test interface circuit according to claim 9, further comprising:
    N second capacitors, respectively coupled between N control ends of the N switches and the reference ground end.

11. The test interface circuit according to claim 1, wherein the tested circuit is disposed on a probe card.

* * * * *